United States Patent
Chen et al.

(10) Patent No.: US 11,721,741 B2
(45) Date of Patent: Aug. 8, 2023

(54) FIELD-EFFECT TRANSISTOR AND METHOD OF FORMING THE SAME

(71) Applicant: Taiwan Semiconductor Manufacturing Company Limited, Hsinchu (TW)

(72) Inventors: Chen-Ping Chen, Yilan County (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 36 days.

(21) Appl. No.: 17/224,509

(22) Filed: Apr. 7, 2021

(65) Prior Publication Data

US 2022/0328646 A1    Oct. 13, 2022

(51) Int. Cl.
| | |
|---|---|
| *H01L 29/49* | (2006.01) |
| *H01L 29/78* | (2006.01) |
| *H01L 29/08* | (2006.01) |
| *H01L 29/06* | (2006.01) |
| *H01L 29/66* | (2006.01) |
| *H01L 29/786* | (2006.01) |
| *H01L 21/28* | (2006.01) |
| *H01L 29/423* | (2006.01) |

(52) U.S. Cl.
CPC .... *H01L 29/4983* (2013.01); *H01L 21/28123* (2013.01); *H01L 29/0673* (2013.01); *H01L 29/0847* (2013.01); *H01L 29/42392* (2013.01); *H01L 29/66545* (2013.01); *H01L 29/66795* (2013.01); *H01L 29/7851* (2013.01); *H01L 29/78618* (2013.01); *H01L 29/78696* (2013.01)

(58) Field of Classification Search
CPC .............. H01L 29/785; H01L 29/0673; H01L 29/0847; H01L 29/66795; H01L 29/42392
See application file for complete search history.

(56) References Cited

U.S. PATENT DOCUMENTS

| | | | |
|---|---|---|---|
| 10,263,100 B1* | 4/2019 | Bi | ..................... H01L 29/66439 |
| 2006/0043463 A1* | 3/2006 | Liu | ....................... H01L 27/115 |
| | | | 257/E27.103 |
| 2015/0053912 A1* | 2/2015 | Ching | ................. H01L 27/0924 |
| | | | 257/9 |
| 2018/0247939 A1* | 8/2018 | Glass | .................. H01L 27/0924 |
| 2019/0109052 A1* | 4/2019 | Reznicek | ........ H01L 21/823814 |
| 2020/0006478 A1* | 1/2020 | Hsu | ................. H01L 21/823821 |
| 2020/0052124 A1* | 2/2020 | Miao | ............... H01L 21/823431 |
| 2020/0091287 A1 | 3/2020 | Glass et al. | |

FOREIGN PATENT DOCUMENTS

TW         201924048 A    6/2019

* cited by examiner

*Primary Examiner* — Changhyun Yi
(74) *Attorney, Agent, or Firm* — Foley & Lardner LLP

(57) ABSTRACT

A semiconductor device is disclosed. The semiconductor device includes a substrate including a semiconductor material. The semiconductor device includes a conduction channel of a transistor disposed above the substrate. The conduction channel and the substrate include a similar semiconductor material. The semiconductor device includes a source/drain region extending from an end of the conduction channel. The semiconductor device includes a dielectric structure. The source/drain region is electrically coupled to the conduction channel and electrically isolated from the substrate by the dielectric structure.

20 Claims, 12 Drawing Sheets

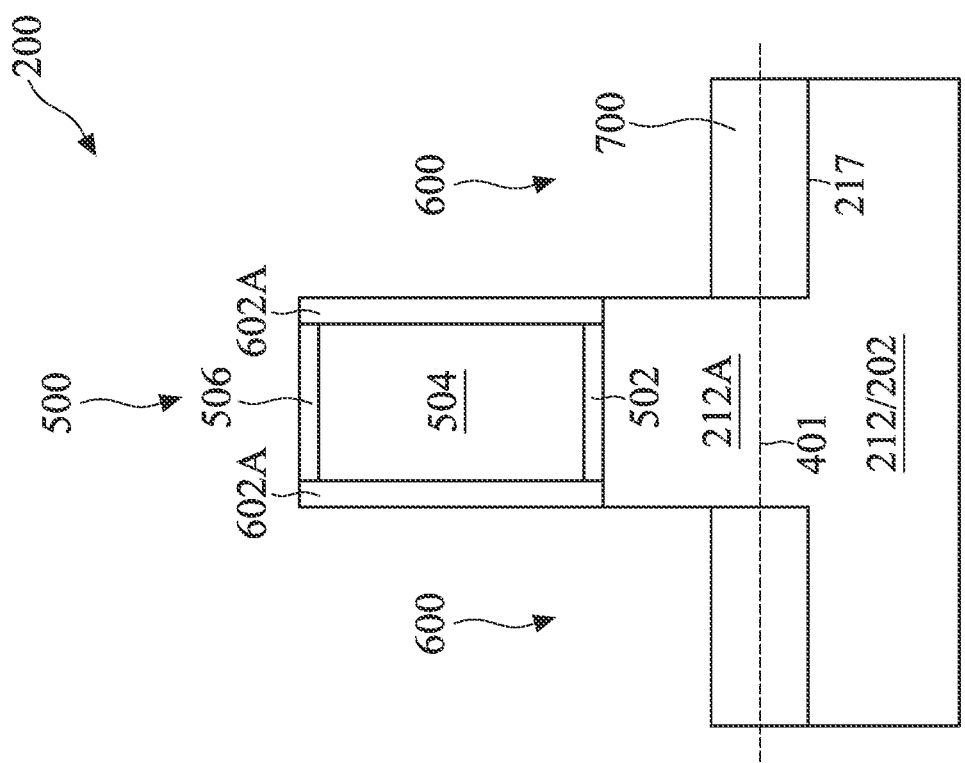
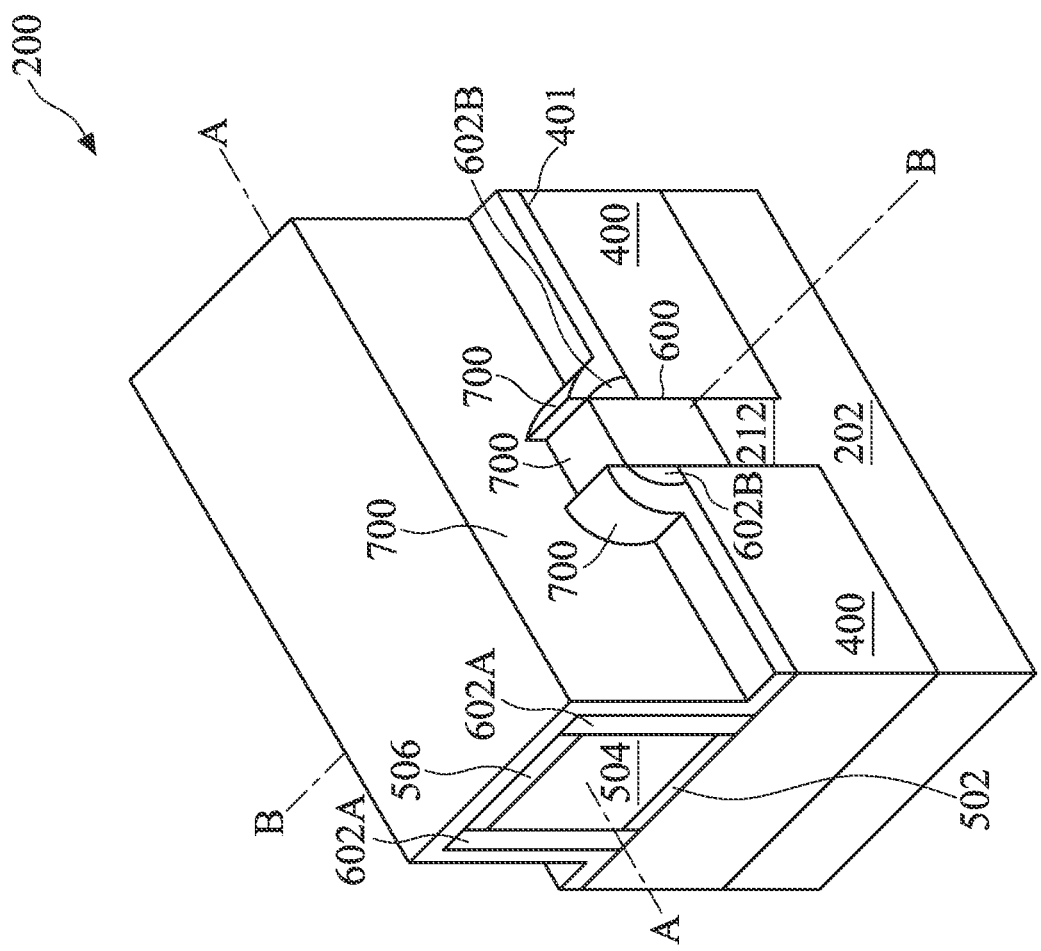
FIG. 7B
FIG. 7A

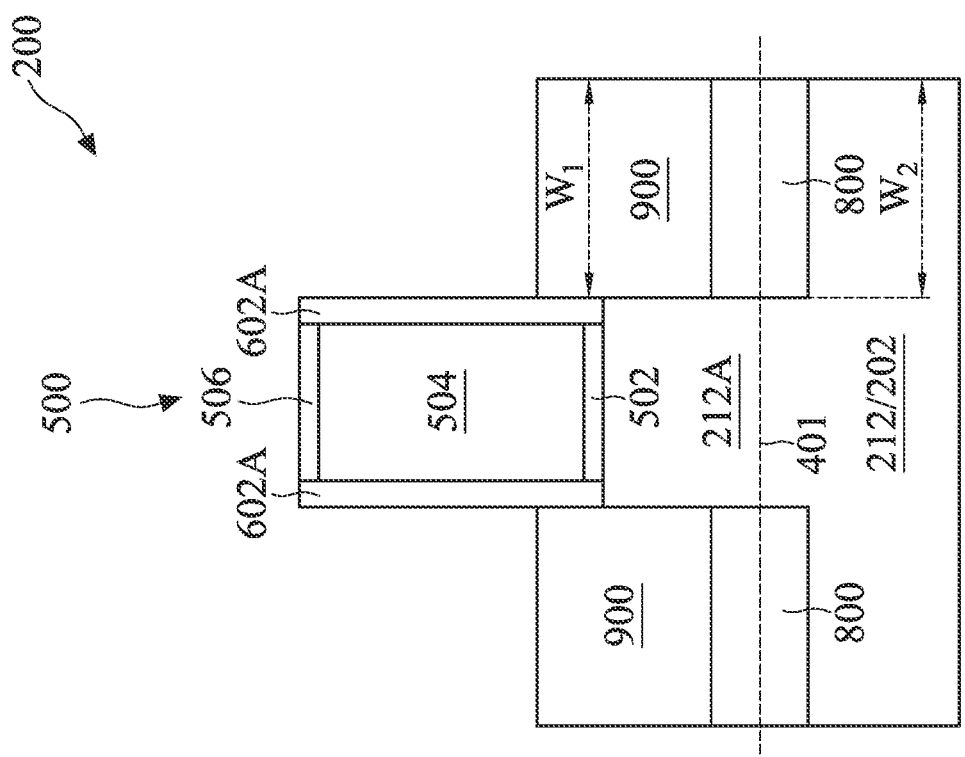
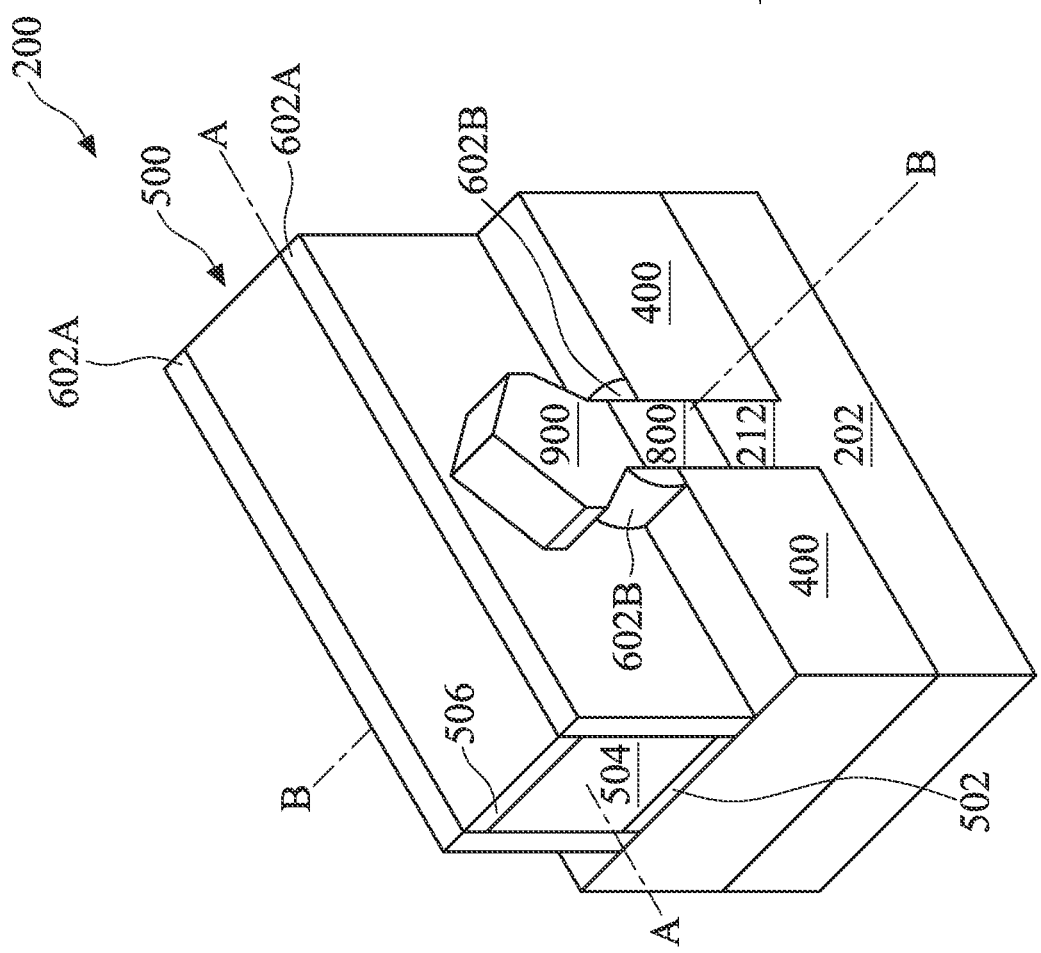
FIG. 9B
FIG. 9A

FIELD-EFFECT TRANSISTOR AND METHOD OF FORMING THE SAME

BACKGROUND

The present disclosure generally relates to semiconductor devices, and particularly to methods of making a non-planar field-effect transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, and 11A illustrate perspective views of an example semiconductor device, made by the method of FIG. 1, during various fabrication stages, in accordance with some embodiments.

FIGS. 2B, 3B, 4B, 5B, 6B, 7B, 8B, 9B, 10B, and 11B illustrate corresponding cross-sectional views of FIGS. 2A, 3A, 4A, 5A, 6A, 7A, 8A, 9A, 10A, and 11A, respectively, in accordance with some embodiments.

DETAILED DESCRIPTION

Figure 1:
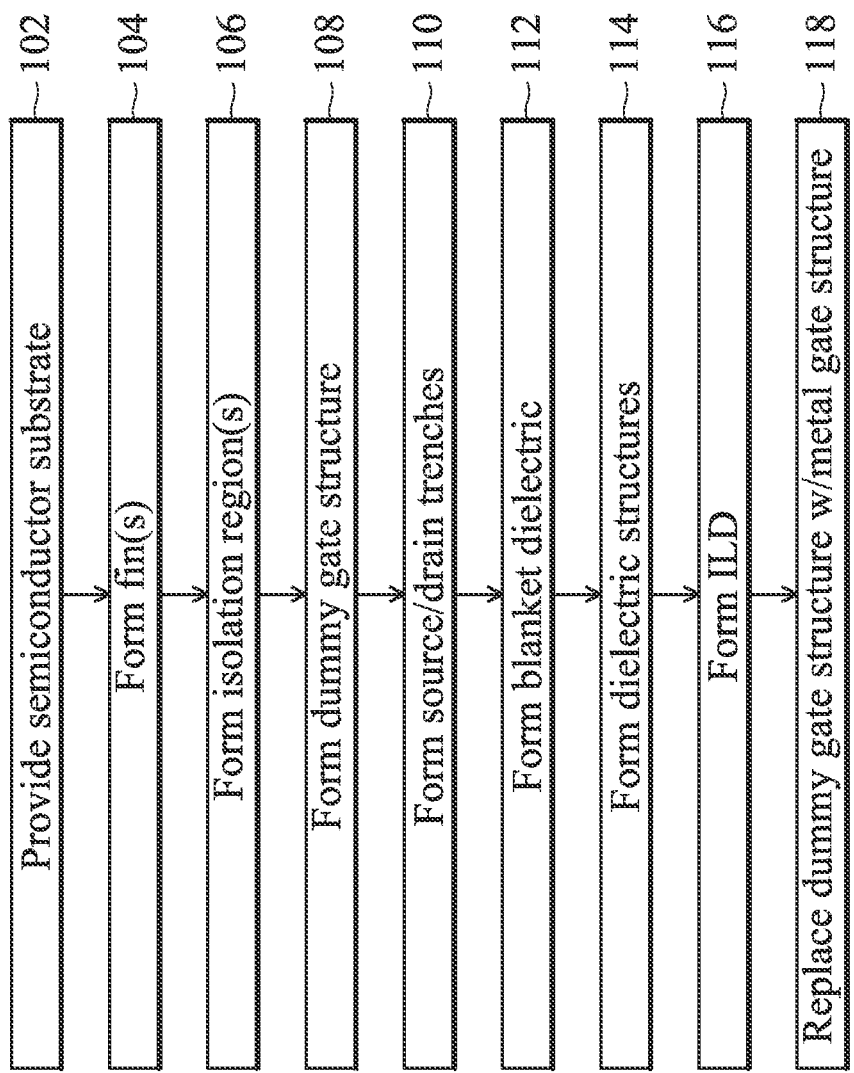
FIG. 1 illustrates a flow chart of an example method for making a non-planar transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a non-planar transistor, and in particular, in the context of forming a transistor having a conduction channel out of a plane in which a substrate is disposed. In some embodiments, a fin is formed over a substrate. Isolation regions are formed to embed a lower portion of the fin, thereby causing an upper portion of the fin to protrude from the isolation regions. A dummy gate structure is formed over the upper portion of the fin. A gate spacer is formed around the dummy gate structure. Concurrently or subsequently, end portions of the fin are removed are removed to form source/drain trenches on respective sides of the dummy gate structure. A dielectric structure is next formed in each of the source/drain trenches, with portions of the sidewalls of the fin exposed. Next, source/drain regions are epitaxially grown over the dielectric structures that are extended from the exposed sidewalls of the fin, respectively. After an interlayer dielectric (ILD) layer is formed over the source/drain regions, the dummy gate structure is removed to form a gate trench in the ILD layer. Next, an active gate feature is formed in the gate trench.

A fin-based transistor formed by the above described method can advantageously minimize a leakage path conducting from one to the other of the source/drain regions through the substrate or the lower portion of the fin. The occurrence of such a leakage path, which is sometimes referred to as a drain induced barrier lowering (DIBL) effect, can cause undesired leakage current. In general, the DIBL effect can become more significant when dimensions of the transistor becomes smaller. Although various methods have been proposed in the existing technologies to improve the leakage (e.g., by forming shallower source/drain trenches), some trade-off is typically required. For example, when forming the source/drain trenches with a shallower depth, corresponding epitaxial source/drain regions may become smaller in dimensions accordingly, which can adversely impact overall performance of the transistor (e.g., decreased $I_{on}$, lower speed). In contrast, various embodiments of the present disclosure include forming the dielectric structure in each of the source/drain trenches prior to growing the source/drain regions so as to eliminate the leakage path. Further, by finely controlling a height of the dielectric structures in the source/drain trenches relative to how much the sidewalls of the fin is exposed, respective dimensions of the source/drain regions can be optimized. Therefore, the overall performance of the transistor, made the currently disclosed method, will not be compromised.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device includes, at least part of, a fin field-effect-transistor (FinFET), but can include any of various other transistors (e.g., a nanosheet field-effect-transistor, a multi-bridge field-effect-transistor, a vertical field-effect-transistor, a carbon nanotube field-effect-transistor) while remaining within the scope of the present disclosure. As employed by the present disclosure, the FinFET refers to any fin-based, multi-gate transistor. It is noted that the method of FIG. 1 does not produce a completed FinFET. A completed FinFET may be fabricated using complementary metal-oxide-semiconductor (CMOS) technology processing. Accordingly, it is understood that additional operations may be provided before, during, and after the method 100 of FIG. 1, and that some other operations may only be briefly described herein.

Referring to FIG. 1, the method 100 starts with operation 102 in which a semiconductor substrate is provided. The method 100 continues to operation 104 in which one or more fins are formed extending beyond a major surface of the semiconductor substrate. The method 100 continues to operation 106 in which one or more isolation regions are formed around a lower portion of each fin. The method 100 continues to operation 108 in which a dummy gate structure is formed over a central portion of each fin. The method 100 continues to operation 110 in which end portions of each fin are removed to form source/drain trenches. The method 100 continues to operation 112 in which a blanket dielectric is formed over the semiconductor substrate. The method 100 continues to operation 114 in which a dielectric structure is formed in each of the source/drain trenches. The method 100 continues to operation 116 in which source/drain regions are formed over the dielectric structures in the source/drain trenches, respectively. The method 100 continues to operation 118 in which an interlayer dielectric (ILD) is formed. The method 100 continues to operation 120 in which the dummy gate structure is replaced with a metal gate structure.

In the following discussions, the operations of the method 100 may be associated with perspective views of a semiconductor device 200 at various fabrication stages as shown in FIGS. 2A, 3A, 4A, 5A, 6A, 7A, 8A, 9A, 10A, and 11A, respectively, and corresponding cross-sectional views, cut either along the longitudinal axis of a corresponding fin (e.g., line B-B as shown below) or the longitudinal axis of a corresponding gate structure (e.g., line A-A as shown below), as shown in FIGS. 2B, 3B, 4B, 5B, 6B, 7B, 8B, 9B, 10B, and 11B. In some embodiments, the semiconductor device 200 may be a FinFET. The FinFET 200 may be included in a microprocessor, memory cell, and/or other integrated circuit (IC). FIGS. 2A through 11B are simplified for a better understanding of the concepts of the present disclosure. Accordingly, although the figures illustrate the FinFET 200, it is understood the IC may comprise a number of other devices comprising resistors, capacitors, inductors, fuses, etc., which are not shown in FIGS. 2A through 11B, for purposes of clarity.

Figure 2B:
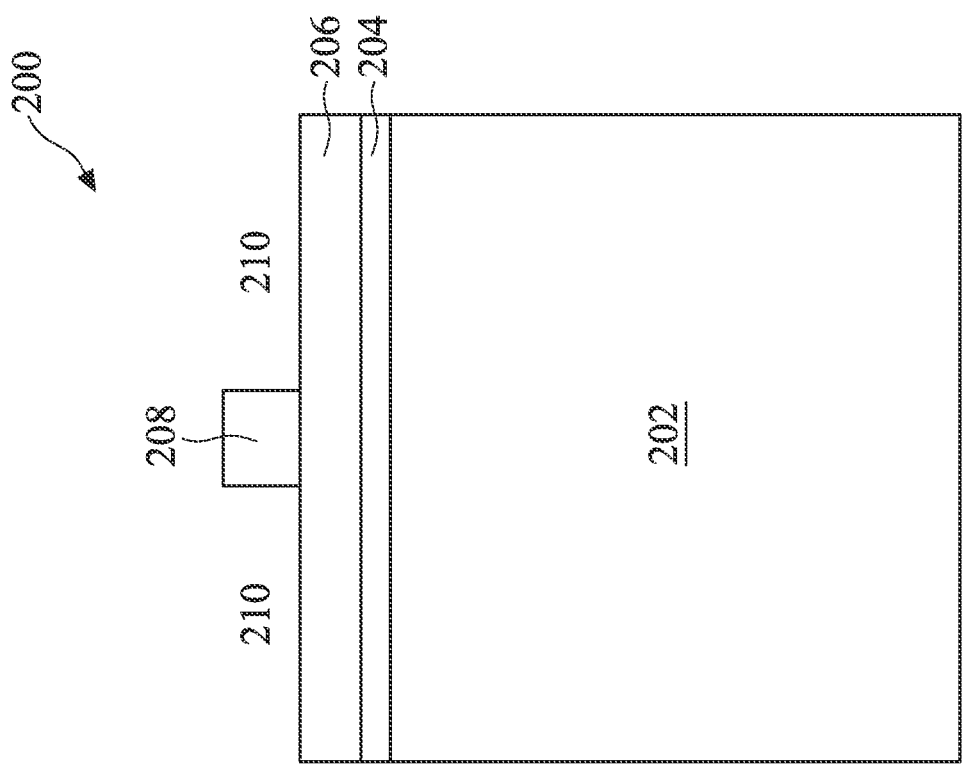
Figure 2A:
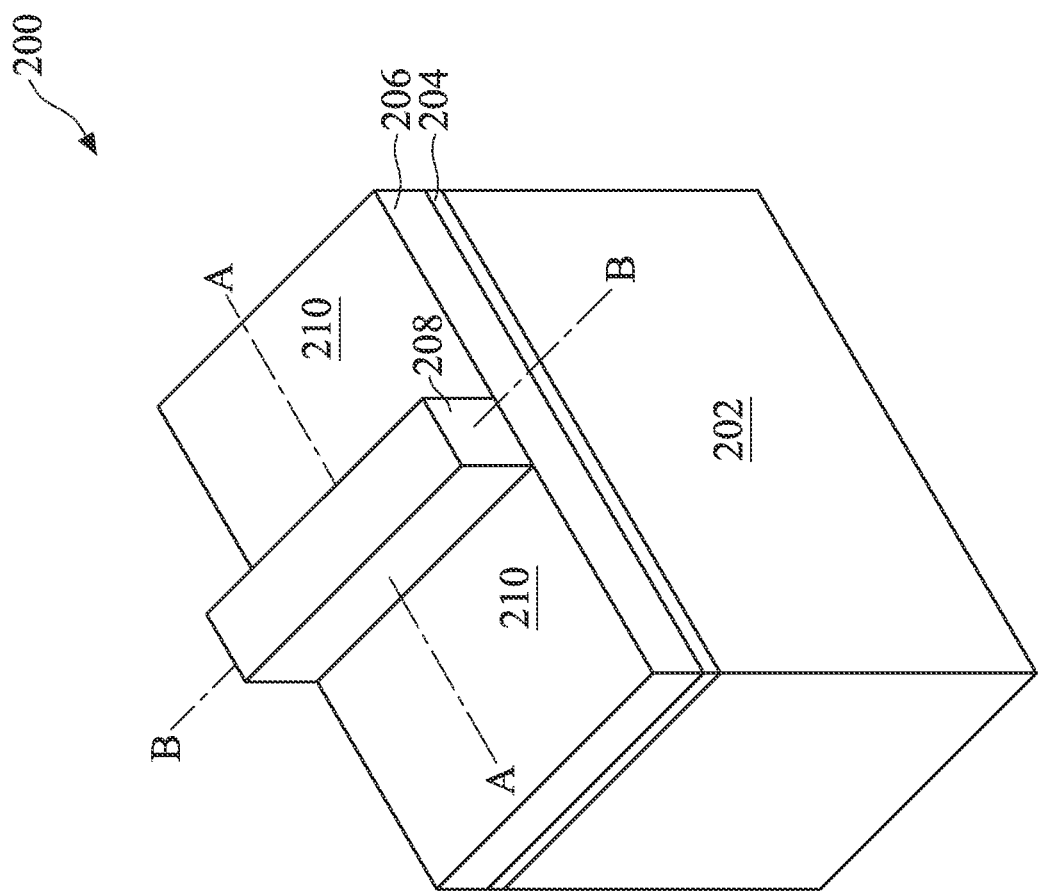

Corresponding to operation 102 of FIG. 1, FIG. 2A is a perspective view of the FinFET 200 including a substrate 202 at one of the various stages of fabrication, according to some embodiments, and FIG. 2B is a cross-sectional view of the FinFET 200 taken along line A-A of FIG. 2A. In some embodiments, the substrate 202 is covered by a pad layer 204, a mask layer 206, and a photo-sensitive layer 208 that is patterned with one or more openings 210. The photo-sensitive layer 208 is patterned to form one or more fins of the FinFET 200, which will be discussed in the following operations.

The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The pad layer 204 may be a thin film comprising silicon oxide formed, for example, using a thermal oxidation process. The pad layer 204 may act as an adhesion layer between the semiconductor substrate 202 and the mask layer 206. The pad layer 204 may also act as an etch stop layer while etching the mask layer 206. In some embodiments, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. The photo-sensitive layer 208 is formed on the mask layer 206, and then patterned thereby forming the openings 210 in the photo-sensitive layer 208.

Figure 3B:
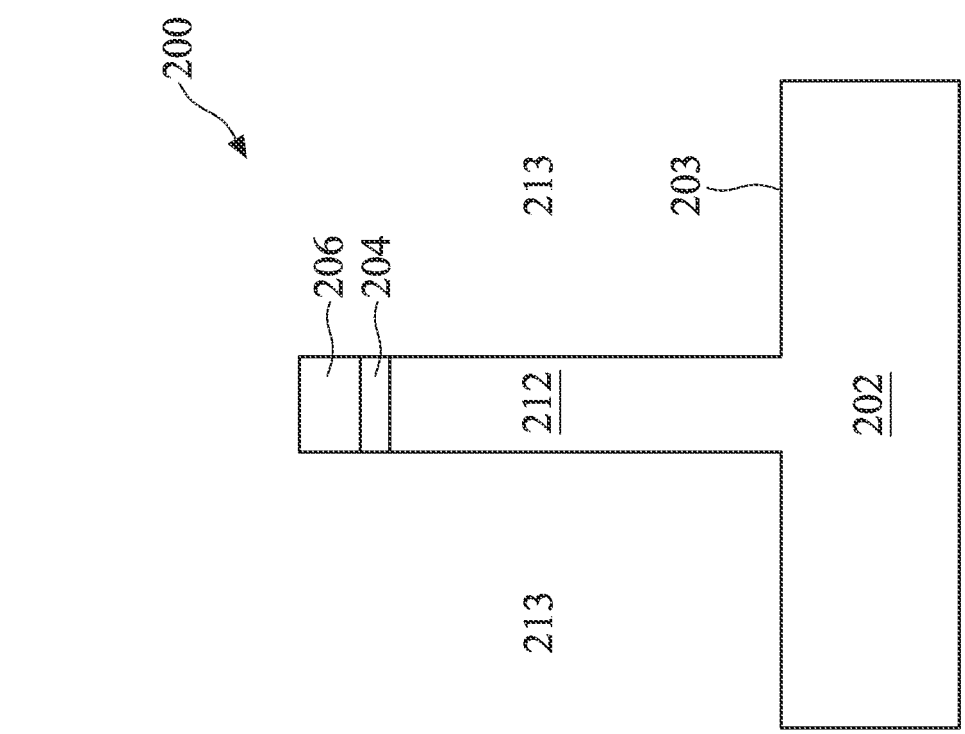
Figure 3A:
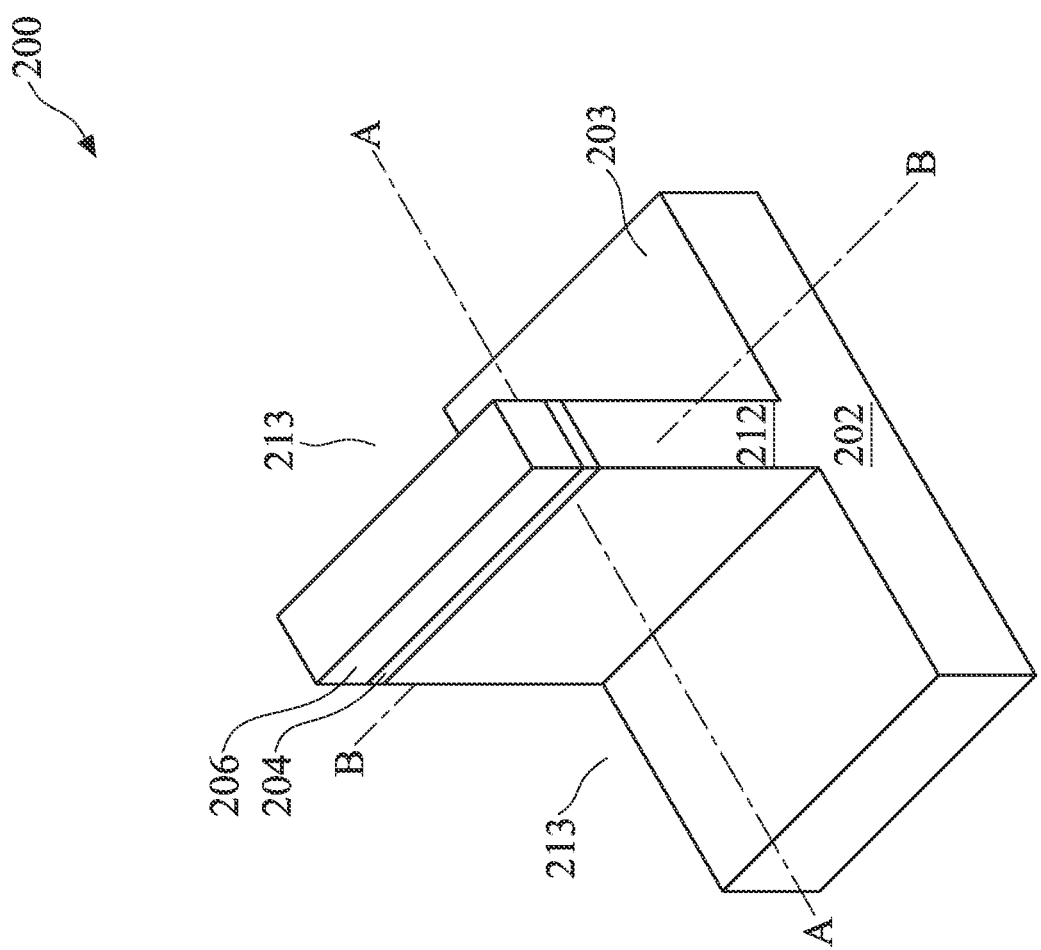

Corresponding to operation 104 of FIG. 1, FIG. 3A is a perspective view of the FinFET 200 including at least a fin 212 at one of the various stages of fabrication, according to some embodiments, and FIG. 3B is a cross-sectional view of the FinFET 200 taken along line A-A of FIG. 3A. As shown, the fin 212 has a longitudinal (or lengthwise) axis extended along line B-B, which is perpendicular to line A-A, and is sandwiched between trenches 213. It is noted that although one fin 212 is shown in the illustrated embodiments of FIGS. 3A-B (and the following figures), any desired number of fins may be formed on the semiconductor substrate 202 using the photo-sensitive layer 208 (FIGS. 2A-B) with a corresponding pattern. As such, when multiple fins are formed on the substrate 202 that are in parallel with one another, the fins can be spaced apart from one another by a corresponding trench 213.

The fin 212 is formed by at least some of the following processes. The mask layer 206 and pad layer 204 are etched through openings 210 (FIGS. 2A-B) to expose underlying semiconductor substrate 202. By using remaining pad layer 204 and the mask layer 206, as shown in FIGS. 3A and 3B, the exposed semiconductor substrate 202 is then etched to form the trenches 213 so as to cause a surface 203 of the semiconductor substrate 202 to be exposed. Portions of the semiconductor substrate 202 sandwiched between the trenches 213 are thus formed as the fin 212. The fin 212 each extends upward from the surface 203. The trenches 213 may be strips (viewed from the top of the FinFET 200) parallel to each other, and closely spaced with respect to each other. After the fin 212 is formed, the photo-sensitive layer 208 (not shown in FIGS. 3A-B for purposes of clarity) is removed. Subsequently, a cleaning process may be performed to remove a native oxide of the semiconductor substrate 202. The cleaning may be performed using diluted hydrofluoric (DHF) acid, or the like.

Figure 4B:
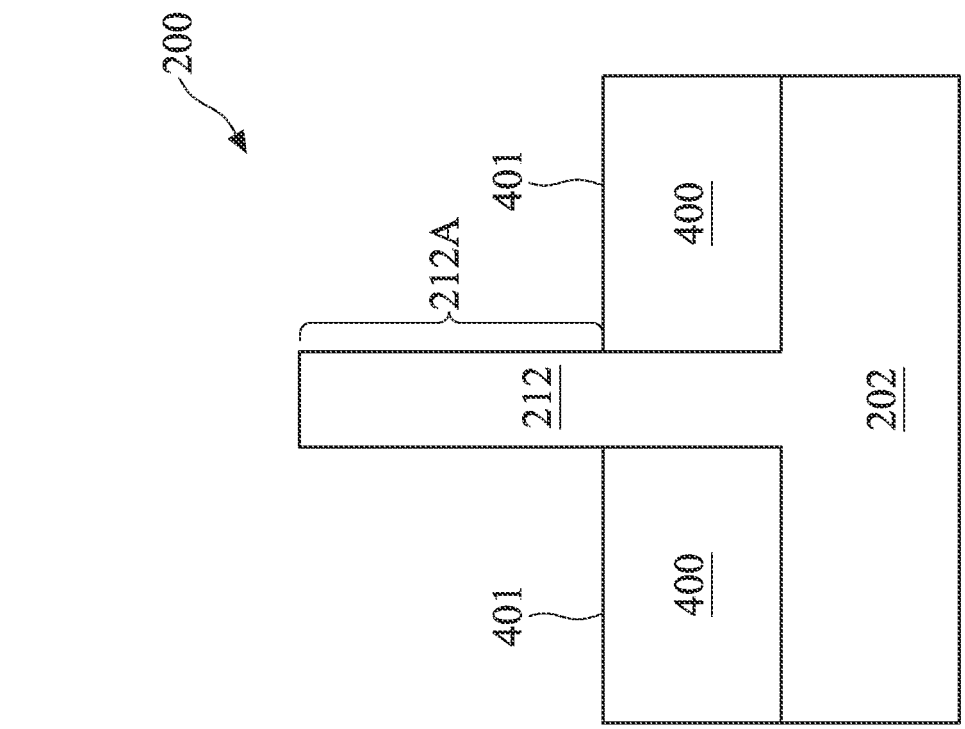
Figure 4A:
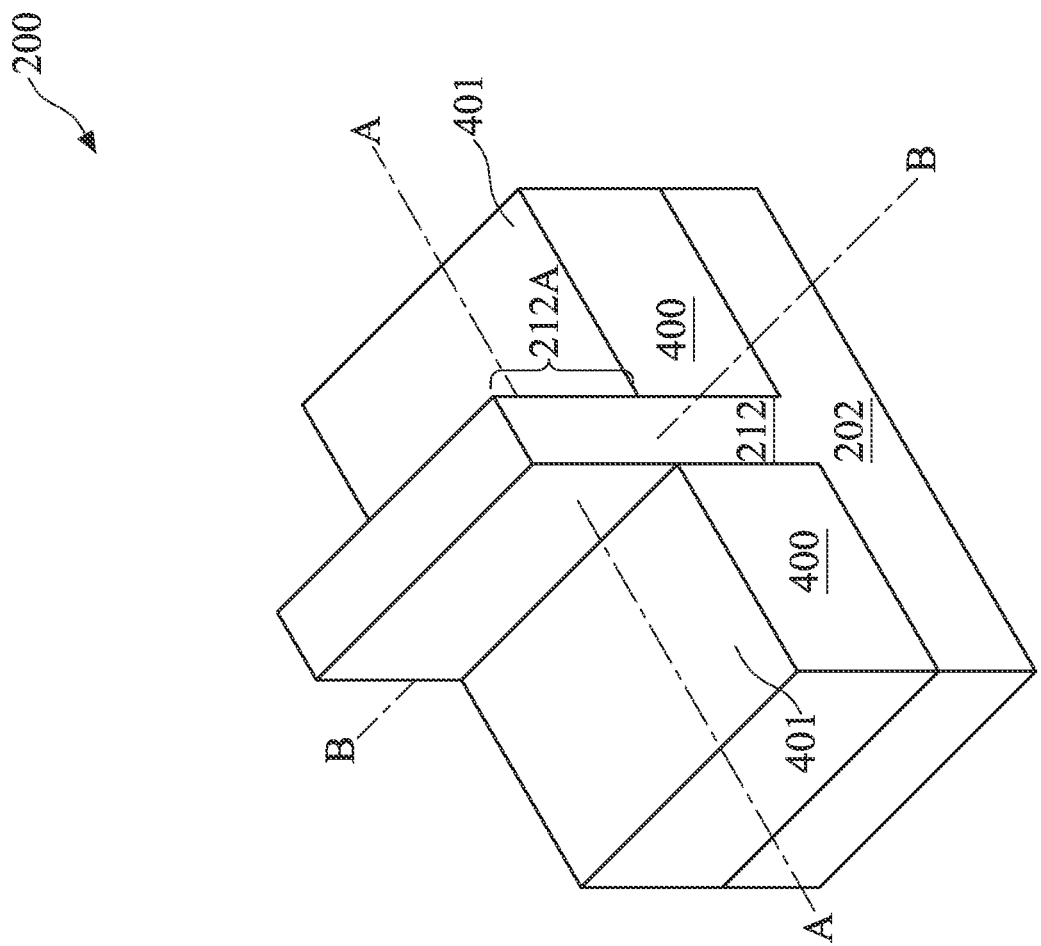

Corresponding to operation 106 of FIG. 1, FIG. 4A is a cross-sectional view of the FinFET 200 including isolation regions 400 at one of the various stages of fabrication, according to some embodiments, and FIG. 4B is a cross-sectional view of the FinFET 200 taken along line A-A of FIG. 4A. The isolation regions 400, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 400 and a top surface of the fin 212 that are coplanar (not shown). The remaining pad layer 204 and the mask layer 206 (FIGS. 3A-B) may also be removed by the planarization process.

In some embodiments, the isolation regions 400 include a liner, e.g., a liner oxide (not shown), at the interface between each of the isolation regions 400 and the substrate 202 (fin 212). In some embodiments, the liner oxide is formed to reduce crystalline defects at the interface between the substrate 202 and the isolation region 400. Similarly, the liner oxide may also be used to reduce crystalline defects at the interface between the fin 212 and the isolation region 400. The liner oxide (e.g., silicon oxide) may be a thermal oxide formed through a thermal oxidation of a surface layer of the substrate 202, although other suitable method may also be used to form the liner oxide.

Next, the isolation regions 400 are recessed to form shallow trench isolation (STI) regions 400, as shown in FIGS. 4A-B. The isolation regions 400 are recessed such that the upper portion of the fin 212 (hereinafter "fin 212A") protrude from between neighboring STI regions 400. In other words, the fin 212A is protruded from a top surface 401 of the STI regions 400. The top surface 401 of the STI regions 400 may have a flat surface (as illustrated), a convex surface, a concave surface (such as dishing), or combinations thereof. The top surface 401 of the STI regions 400 may be formed flat, convex, and/or concave by an appropriate etch. The isolation regions 400 may be recessed using an acceptable etching process, such as one that is selective to the material of the isolation regions 400. For example, a dry etch or a wet etch using dilute hydrofluoric (DHF) acid may be performed to recess the isolation regions 400.

Figure 5B:
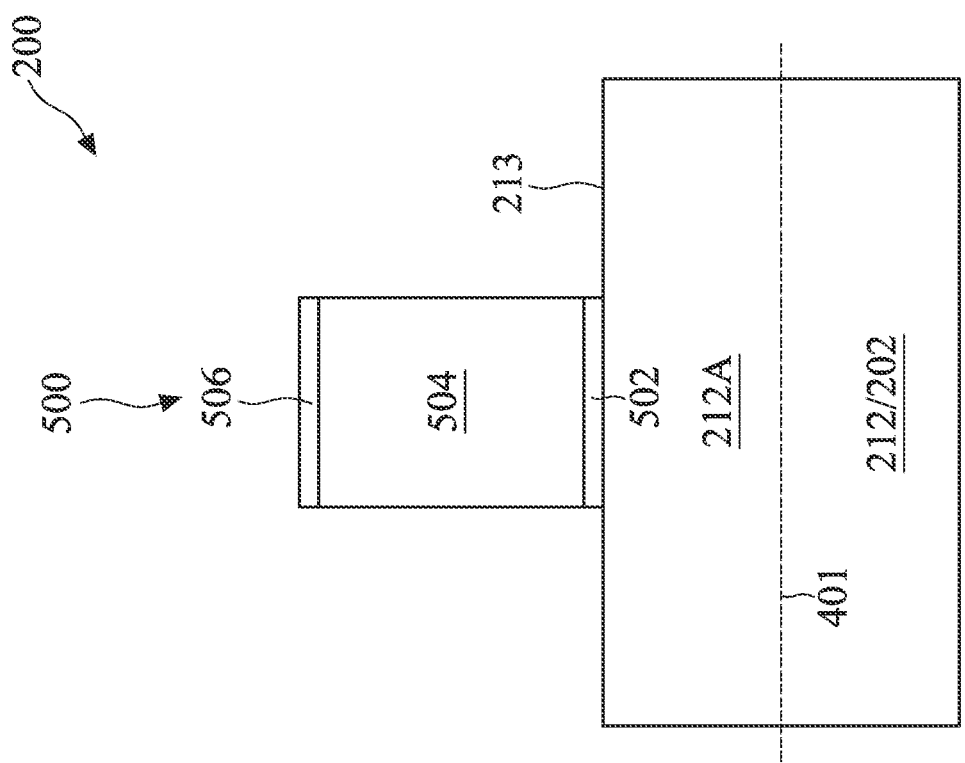
Figure 5A:
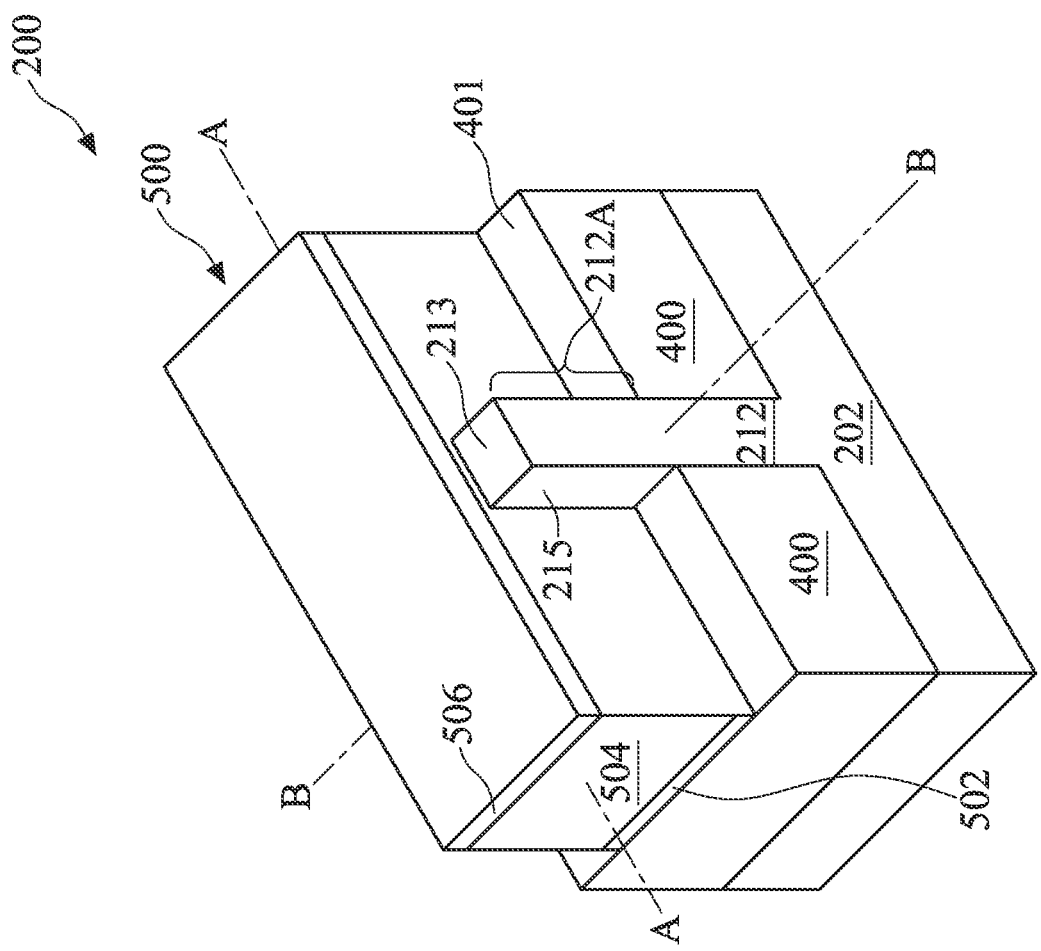

Corresponding to the operation 108 of FIG. 1, FIG. 5A is a perspective view of the FinFET 200 including a dummy gate structure 500 at one of the various stages of fabrication, according to some embodiments, and FIG. 5B is a cross-sectional view of the FinFET 200 taken along line B-B of FIG. 5A. As shown, the dummy gate structure 500 has a longitudinal (or lengthwise) axis extended along line A-A, which is perpendicular to the longitudinal axis of the fin 212 (line B-B). In some embodiments, the dummy gate structure 500 overlays a central portion of the fin 212A, e.g., overlaying a top surface 213 and sidewalls 215 of the central portion of the fin 212A. Such a central portion of the fin 212A, overlaid by the dummy gate structure 500, may serve as a conduction channel of the FinFET 200 to conduct a current flowing along line B-B.

The dummy gate structure 500 includes a dummy gate dielectric 502 and a dummy gate electrode 504, which will be removed in a later removal (e.g., etching) process to form a metal (or otherwise active) gate structure. The dummy gate dielectric 502 and the dummy gate electrode 504 may be formed by performing at least some of the following processes. A dielectric layer (used to form the dummy dielectric 502) is formed over the fin 212A. The dielectric layer may be, for example, silicon oxide, silicon nitride, multilayers thereof, or the like, and may be deposited or thermally grown. Next, a gate layer (used to form the dummy gate electrode 504) is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form a mask 506. The pattern of the mask 506 then may be transferred to the gate layer and the dielectric layer by an acceptable etching technique to form the dummy gate dielectric 502 and the dummy gate electrode 504, respectively.

The dummy gate dielectric 502 is shown to be formed over the fin 212A (e.g., over top surface 213 and sidewalls 215 of the fin 212A) and over the isolation regions 400 in the example of FIGS. 5A-B. In other embodiments, the dummy gate dielectric 502 may be formed by, e.g., thermal oxidization of a material of the fin 212A, and therefore, may be formed over the fin 212A but not over the STI regions 400. It should be appreciated that these and other variations are still included within the scope of the present disclosure.

Figure 6B:
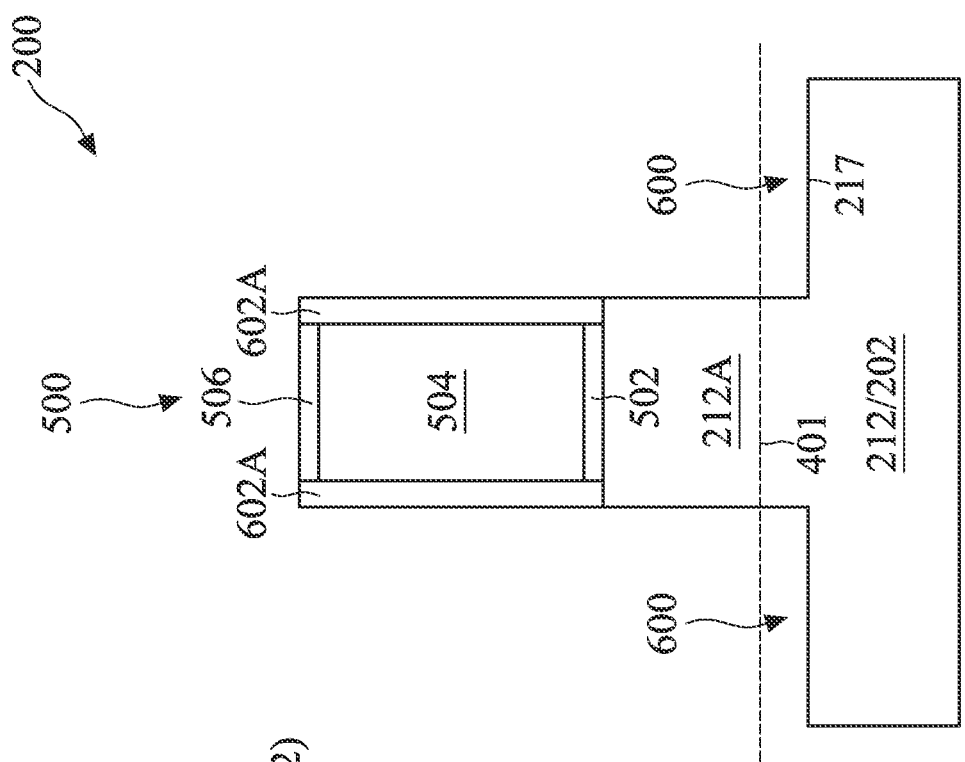
Figure 6A:
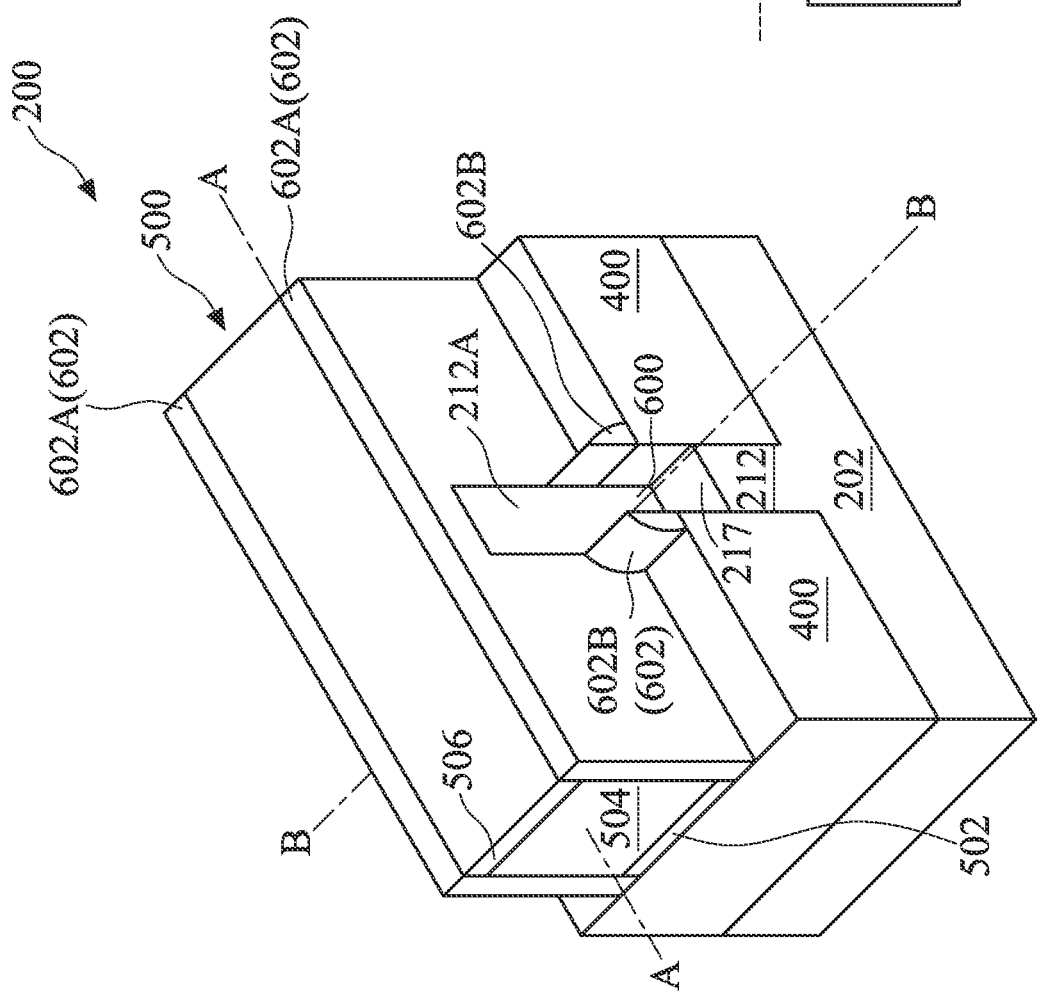

Corresponding to the operation 110 of FIG. 1, FIG. 6A is a perspective view of the FinFET 200 including source/drain trenches 600 and a gate spacer 602 at one of the various stages of fabrication, according to some embodiments, and FIG. 6B is a cross-sectional view of the FinFET 200 taken along line B-B of FIG. 6A. In some embodiments, the source/drain trenches 600 are formed on opposite sides of the dummy gate structure 500. In some embodiments, the gate spacer 602 may be formed around the dummy gate structure 500. For example, the gate spacer 602 can include at least a first portion and a second portion, 602A, respectively extended along sidewalls of the dummy gate structure 500. The gate spacer 602 can also include portions, 602B, that are extended from the first and second portions 602A along the line B-B, as shown in FIG. 6A. Such extended portions 602B may be subsequently used to direct or confine growth of the source/drain regions from the source/drain trenches 600. In the example of FIG. 6A, the extended portion 602B is shown to have a cross-section in a quarter circle shape. However, it should be understood that the cross-section of the extended portion 602B can have any of various other shapes (e.g., a fan shape, a rectangular shape, a trapezoidal shape, etc.), while remaining within the scope of the present disclosure.

In some embodiments, the gate spacer 602 and the source/drain trenches 600 may be concurrently formed. For example, a dielectric layer (used to form the gate spacer 602) is deposited over the dummy gate electrode 504 and the end (exposed) portions of the fin 212A (FIG. 5A). The dielectric layer may be, for example, silicon oxide, silicon nitride, multilayers thereof, or the like. Any suitable deposition method, such as thermal oxidation, chemical vapor deposition (CVD), or the like, may be used to form the dielectric layer. Next, one or more photolithography processes and one or more etching processes are performed on the dielectric layer to concurrently form the gate spacer 602 and the source/drain trenches 600. The etching process may be anisotropic. As such, portions of the dielectric layer at the corner of the fin 212A and isolation regions 400 may remain, which forms the extended portion 602B. When anisotropically etching the dielectric layer, a portion of the dielectric layer overlaying the mask 506 may be removed. Accordingly, the mask 506 may be re-exposed. It should be understood that the gate spacer 602 may be formed subsequently to or prior to the formation of the source/drain trenches 600, while remaining within the scope of the present disclosure.

Prior to or subsequently to the source/drain trenches 600 being formed, sidewalls of the central portion of the fin 212A that is overlaid by the dummy gate electrode 504 and gate spacer portion 602A can be exposed, as shown in FIGS. 6A-B. The sidewalls of the fin 212A are opposite to each other along the line B-B. Such exposed sidewalls of the fin 212A can be used to epitaxially grow the source/drain regions in the source/drain trenches 600, in some embodiments. In addition to exposing the sidewalls of the fin 212A, the source/drain trenches 600 can expose a surface of the fin 212, e.g., surface 217. In the illustrated embodiment of FIGS. 6A-B (and the following figures), the surface 217 is vertically below the top surface 401 of the isolation regions 400. However, it should be understood that the surface 217 may be formed to be vertically aligned with or above the top surface 401, while remaining within the scope of the present disclosure.

Corresponding to the operation 112 of FIG. 1, FIG. 7A is a perspective view of the FinFET 200 including a blanket dielectric 700 at one of the various stages of fabrication, according to some embodiments, and FIG. 7B is a cross-sectional view of the FinFET 200 taken along line B-B of FIG. 7A. As shown, the blanket dielectric 700 may be formed to overlay the dummy gate structure 500 (which includes the dummy gate dielectric 502 and dummy gate electrode 504), the gate spacer 602 (which includes portions 602A and 602B), and the isolation regions 400, and fill at least a lower portion of each of the source/drain trenches 600. By filling at least the lower portion of the source/drain trench 600 with the blanket dielectric 700, the exposed surface 217 of the fin 212 can be covered by a dielectric material, which causes the fin 212 to be electrically insulated from any conductive features subsequently formed over the fin 212.

The blanket dielectric 700 may include a material selected from the group consisting of silicon oxide, silicon nitride, silicon carbide, silicon oxycarbide, silicon oxynitride, silicon carbonitride, silicon oxycarbonitride, and combinations thereof. In some embodiments, the blanket dielectric 700 and the gate spacer 602 may have different materials to provide etching selectivity in subsequent processes. The blanket dielectric 700 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the blanket dielectric 700 may include a high-κ dielectric material. As such, the blanket dielectric 700 may have a κ value greater than about 4.0 or even greater than about 7.0, and may include a metal oxide or a silicate of Hf, Al, Zr, La, Mg, Ba, Ti, Pb, and combinations thereof. The formation methods of such a high-κ blanket dielectric 700 may include molecular beam deposition (MBD), atomic layer deposition (ALD), PECVD, and the like.

Figure 8B:
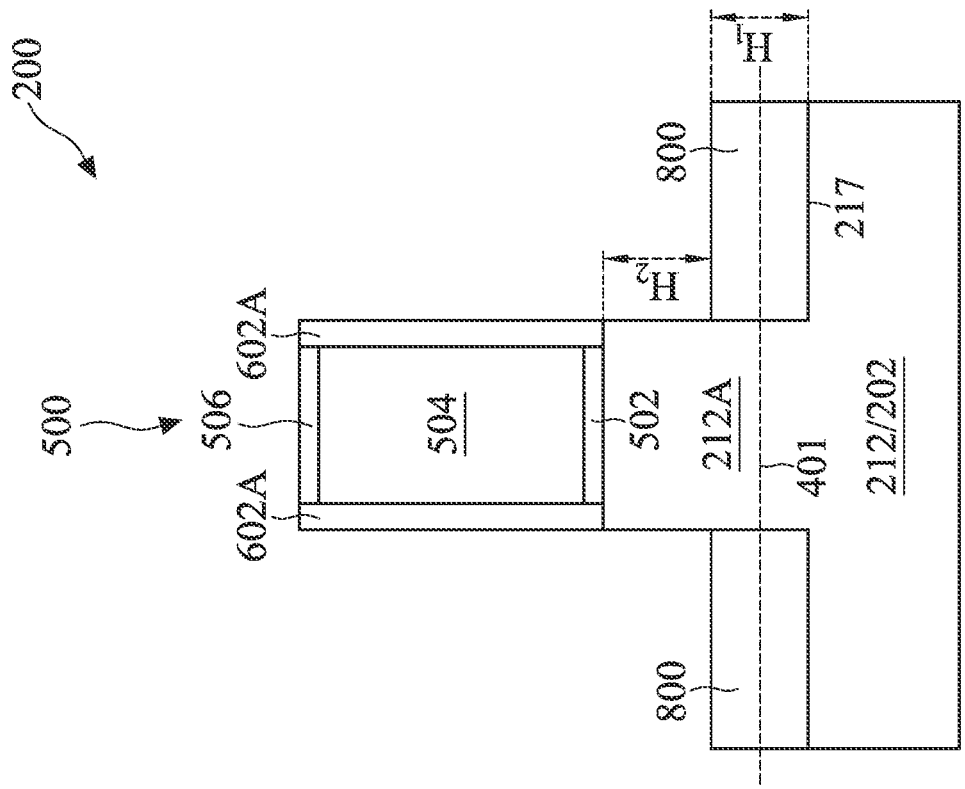
Figure 8A:
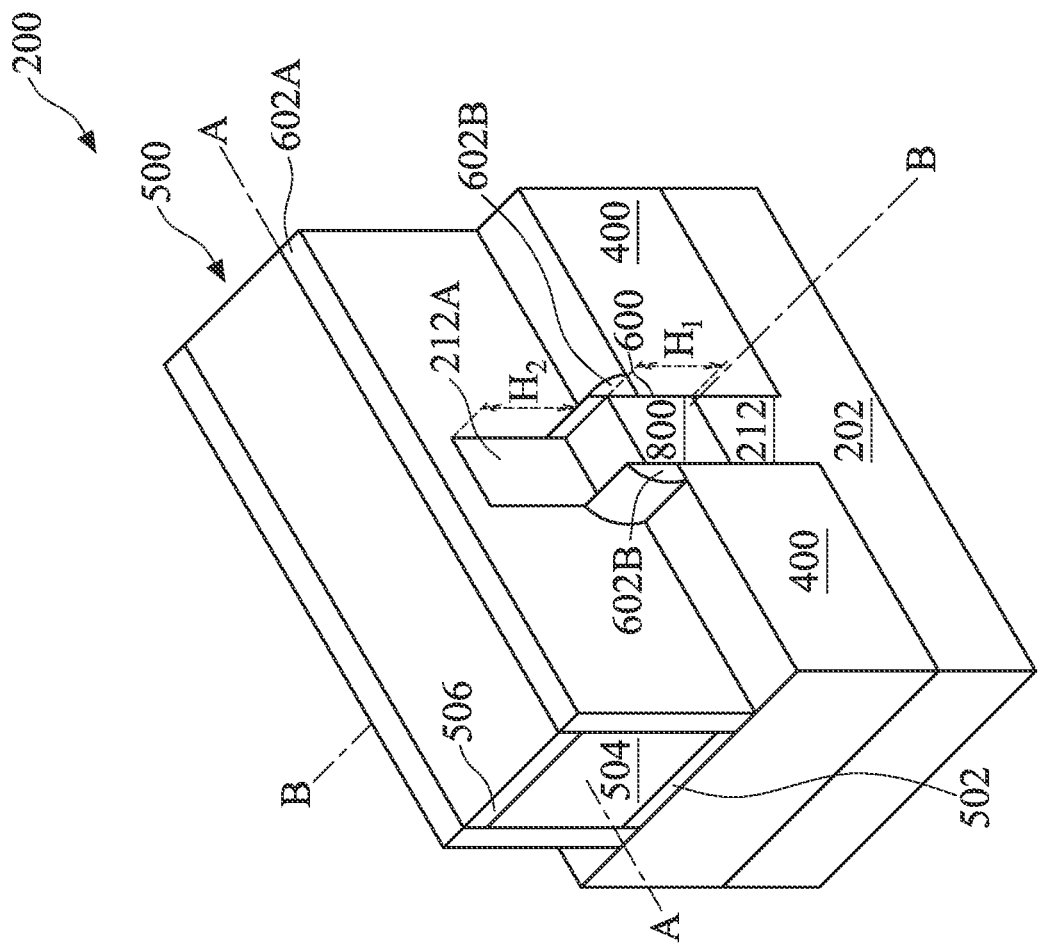

Corresponding to the operation 114 of FIG. 1, FIG. 8A is a perspective view of the FinFET 200 including dielectric structures 800 at one of the various stages of fabrication, according to some embodiments, and FIG. 8B is a cross-sectional view of the FinFET 200 taken along line B-B of FIG. 8A. As shown, in each of the source/drain trenches 600, one of the dielectric structures 800 is formed. In accordance with some embodiments, the dielectric structure 800 is configured to elevate or otherwise separate a subsequently formed conductive feature (e.g., a source/drain region) from the fin 212, thereby electrically isolating the conductive feature from the underlying fin 212 or substrate 202. In turn, a leakage path from one to the other of the source/drain regions through the fin 212 or substrate 202 can be advantageously eliminated. As such, performance of the FinFET 200 can be significantly improved, e.g., decreased $I_{off}$, increased $I_{on}/I_{off}$ ratio, etc.

The dielectric structure 800 may be formed by performing at least one dry or wet etching process to remove the portion of the blanket dielectric 700 (FIGS. 7A-B) but partially leave the portion in source/drain trench 600. In some embodiments, the dry or wet etching process may selectively remove the blanket dielectric 700, while leaving the gate spacer 602 substantially intact. For example, the dry or wet etching process may etch the material of the blanket dielectric 700 at a higher rate (e.g., 5 times greater) than the material of the gate spacer 602. The etching process may stop at the gate spacer 602 (e.g., 602B). As such, while a majority portion of the blanket dielectric 700 is etched away, the portion of the blanket dielectric 700 (e.g., the dielectric structure 800) that extends into the source/drain trench 600 can remain.

For example, the wet etching process can include using diluted hydrofluoric acid (DHF), and/or an amine derivative etchant (e.g., $NH_4OH$, $NH_3(CH_3)OH$, TetraMethyl Ammonium Hydroxide (TMAH), etc.). The etchant may be mixed with a select oxidizer to have a higher etching rate on the material of the blanket dielectric 700 than the respective materials of the gate spacer 602, the mask 506, and the isolation regions 400. For example, the oxidizer may be a fluoride-based acid, for example, hydrofluoric acid (HF), fluoroantimonic acid ($H_2FSbF_6$), etc.

In another example, the dry etching process includes using a plasma of reactive gas that is selected from: fluorocarbon based gas (e.g., $CF_4$, $CHF_3$, $CH_2F_2$, $CH_3F$, $CF_x$, $C_xF_y$), sulfur fluoride based gas (e.g., $SF_6$, $SF_4$, $S_2F_{10}$), oxygen, chlorine, boron trichloride, nitrogen, argon, helium, or combinations thereof. Operation conditions of the plasma process may be selected to have a higher etching rate on the material of the blanket dielectric 700 than the respective materials of the gate spacer 602, the mask 506, and the isolation regions 400. For example, the plasma process can be on the order of about 5 mTorr~about 5 Torr with a radio frequency (RF) power in the range of about 50 watts (W)~1500 W to produce a temperature less than about 500° C. Process gas flows can vary according to the desired optimal process conditions, and examples include: (i) $CH_2F_2$=20 sccm~80 sccm; Ar=100 sccm~500 sccm; $O_2$=20 sccm~150 sccm; and (ii) $CH_3F$=10 sccm~50 sccm; Ar=100 sccm~500 sccm; $O_2$=20 sccm~150 sccm.

A top surface of the dielectric structure 800 may have a flat surface (as illustrated), a convex surface, a concave surface (such as dishing), or combinations thereof. The top surface of the dielectric structure 800 may be formed flat, convex, and/or concave by an appropriate etching process. In some embodiments, a profile of the top surface of the dielectric structure 800 may affect a rate or otherwise efficiency to epitaxiallly grow a source/drain region above the dielectric structure 800, which will be discussed below with respect to FIGS. 9A-B. In certain cases, having the top surface of the dielectric structure 800 to have a v-shape (e.g., a convex) may advantageously help the growth of the source/drain region.

As shown in FIG. 8B, the dielectric structure 800 can be extended from the surface 217 of the fin 212 to a certain point of the source/drain trench 600 to have a height, $H_1$, which can range from about 1 nanometer (nm) to 100 nm. In some embodiments, the height, $H_1$, may be controlled via various operation conditions of the etching process such as, for example, time, temperature, concentration, pressure, power, etc. In some embodiments, the height, $H_1$, may be selected to cause a top surface of the dielectric structure 800 to be vertically lower than a top surface of the extended (gate spacer) portions 602B, as illustrated in FIGS. 8A-B. In some embodiments, the height, $H_1$, may be selected to cause portions of the sidewalls of the fin 212A to be re-exposed with a height, $H_2$, as illustrated in FIGS. 8A-B. A ratio of $H_1$ to $H_2$ may be optimized tuned to meet overall performance of the completed FinFET 200. As such, the source/drain regions can be epitaxially grown from the re-exposed sidewalls of the fin 212A and directed by the gate spacer portions 602B, which will be discussed as follows.

Corresponding to the operation 116 of FIG. 1, FIG. 9A is a perspective view of the FinFET 200 including source/drain regions 900 at one of the various stages of fabrication, according to some embodiments, and FIG. 9B is a cross-sectional view of the FinFET 200 taken along line B-B of FIG. 9A. The source/drain regions 900 are formed on the opposite sides of the dummy gate structure 500. Further, as shown, each of the source/drain regions 900 is formed in one of the source/drain trenches 600, with one of the dielectric structures 800 vertically spaced it apart from the fin 212.

The source/drain regions 900 are formed by epitaxially growing a semiconductor material from the exposed sidewalls of the fin 212A (FIG. 8A) in the source/drain trenches 600, with the extended portion 602B confining or guiding the growth. Thus, it is appreciated that although the source/drain regions 900 are vertically spaced apart from the fin 212, each of the source/drain regions 900 is extended from (e.g., physically connected to) the ends of the fin 212A, which functions as the conduction channel of the FinFET 200. As shown in FIG. 9B (cut across the line B-B of FIG. 9A), the source/drain regions 900 have a width, $W_1$. The width, $W_1$, may be equal to or greater than a width, $W_2$, of the dielectric structure 800, which depends on various operation conditions of the epitaxial growth. Various suitable methods can be used to epitaxially grow the source/drain regions 900 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting FinFET 200 is an n-type FinFET, the source/drain regions 900 may include silicon carbide (SiC), silicon phosphorous (SiP), phosphorous-doped silicon carbon (SiCP), or the like. When the resulting FinFET 200 is a p-type FinFET, the source/drain regions 900 may include SiGe, and a p-type impurity such as boron or indium.

The source/drain regions 900 may be implanted with dopants to form the source/drain regions 900, followed by an anneal process. The implanting process may include forming and patterning masks such as a photoresist to cover the regions of the FinFET 200 that are to be protected from the implanting process. The source/drain regions 900 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain region 900 of a P-type transistor. N-type impurities, such as phosphorous or arsenide, may be implanted in the source/drain regions 900 of an N-type transistor. In some embodiments, the epitaxial source/drain regions may be in situ doped during growth.

In some other embodiments, the extended portions 602B on the sides (along the line A-A) of each of the dielectric structures 800 may have different dimensions. For example, one of the gate spacer portions 602B may have a relatively taller height along one of the sidewalls of the dielectric structure 800, and the other of the gate spacer portions 602B may have a relatively shorter height along the other of the sidewalls of the dielectric structure 800, which may cause the corresponding source/drain region 900 to grow asymmetrically toward different sides along the line A-A. As such, the source/drain region 900 may include two portions, one of which is disposed on a first side with a relatively longer width along the line A-A, and the other of which is disposed on a second side with a relatively shorter width along the line A-A.

Figure 10B:
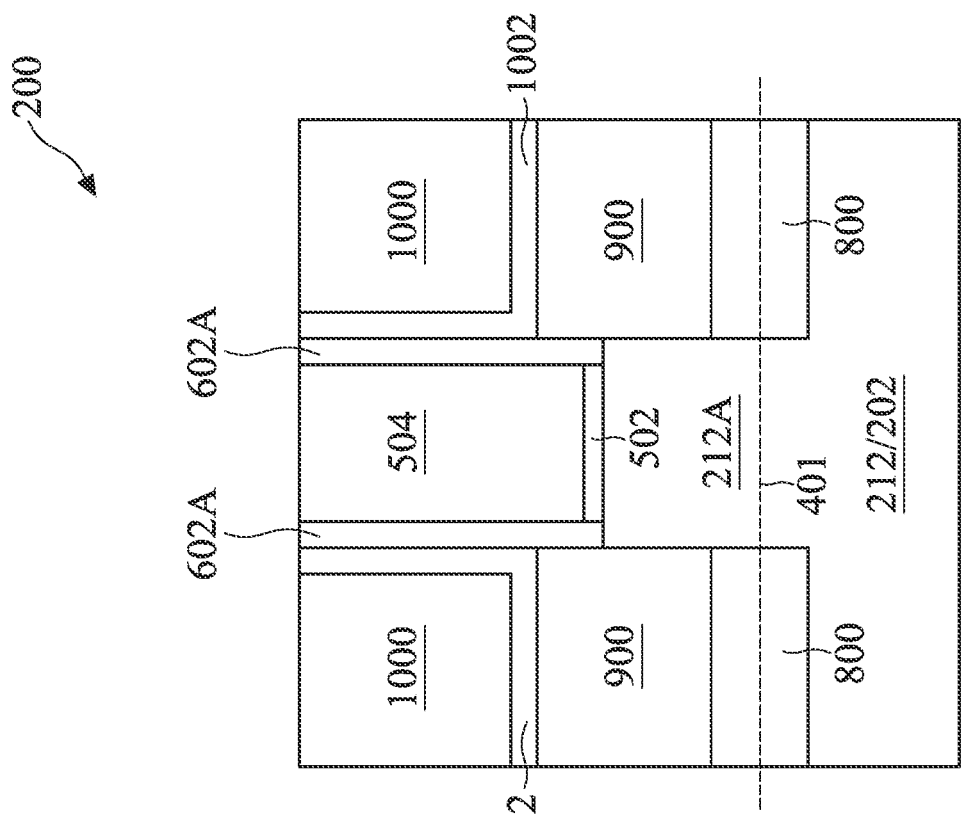
Figure 10A:
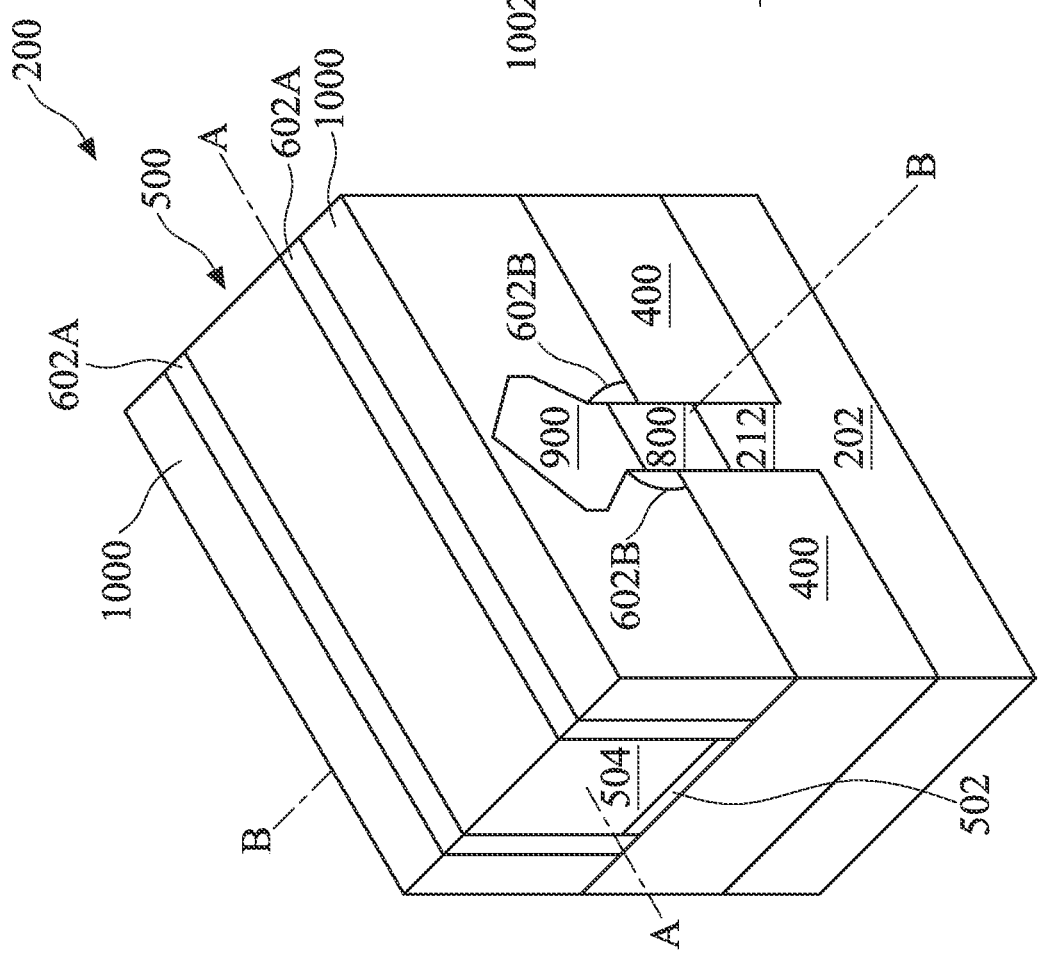

Corresponding to the operation 118 of FIG. 1, FIG. 10A is a perspective view of the FinFET 200 including an interlayer dielectric (ILD) 1000 at one of the various stages of fabrication, according to some embodiments, and FIG. 10B is a cross-sectional view of the FinFET 200 taken along line B-B of FIG. 10A. As shown, the ILD 1000 is formed on the sides of the dummy gate structure 500 (or gate spacer portions 602A) to overlay the source/drain regions 900.

In some embodiments, the ILD 1000 is formed over a contact etch stop layer (CESL) 1002, as shown in the cross-sectional view of FIG. 10B. The CESL 1002 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1000 is formed over the CESL 1002 and over the dummy gate structures 500. In some embodiments, the ILD 1000 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1000 is formed, a planarization process, such as a CMP process, may be performed to achieve a level upper surface for the ILD 1000. The CMP may also remove the mask 506 (see, e.g., FIGS. 9A-B) and portions of the CESL 1002 disposed over the dummy gate structure 500. After the planarization process, the upper surface of the ILD 1000 can be level with the upper surface of the dummy gate structure 500, in some embodiments.

Figure 11B:
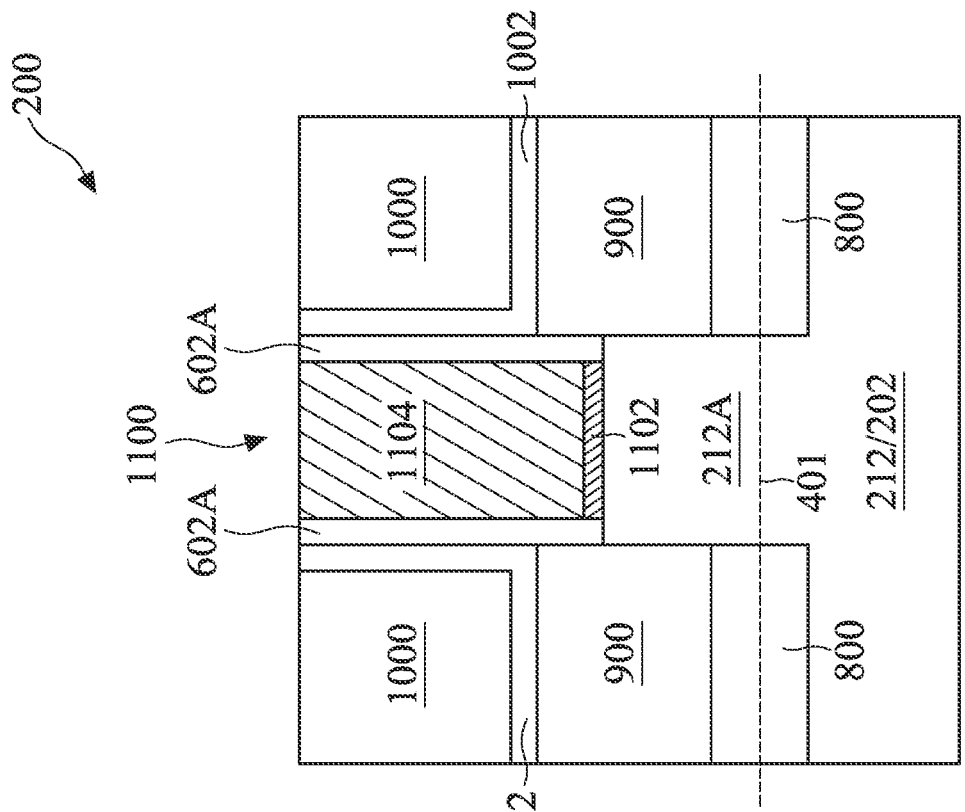
Figure 11A:
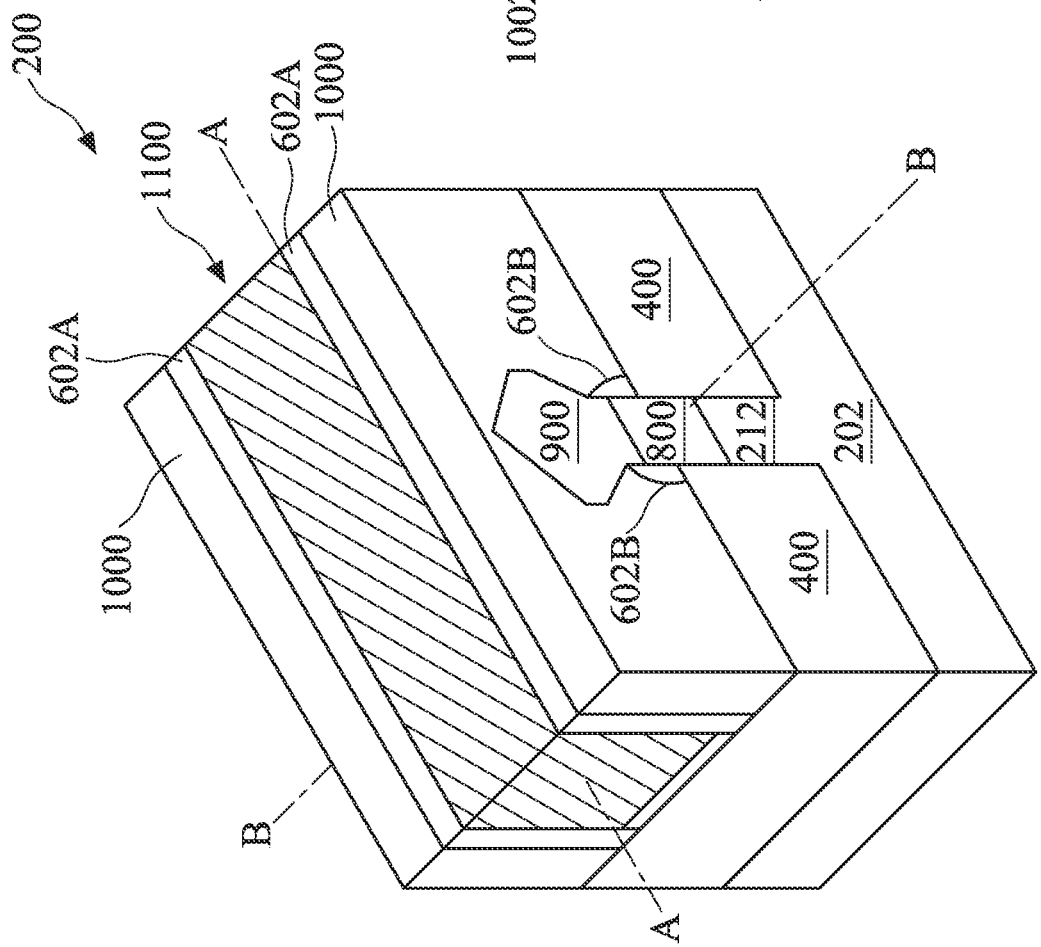

Corresponding to the operation 120 of FIG. 1, FIG. 11A is a perspective view of the FinFET 200 including an active gate structure 1100 at one of the various stages of fabrication, according to some embodiments, and FIG. 11B is a cross-sectional view of the FinFET 200 taken along line B-B of FIG. 11A. An example gate-last process (sometimes referred to as replacement gate process) is performed subsequently to replace the dummy gate structure 500 with the active gate structure 1100 (which may also be referred to as a replacement gate structure or a metal gate structure).

In some embodiments, the active gate structure 1100 may include at least one gate dielectric layer 1102 and at least one conductive gate electrode 1104, as shown in the cross-sectional view of FIG. 11B. The central portions of the fin 212A is overlaid by the conductive gate electrode 1104 with the gate dielectric layer 1102 sandwiched therebetween. The gate dielectric layer 1102 may include a high-k dielectric material (e.g., with a κ value greater than about 4.0 or even greater than about 7.0). In such embodiments, the high-κ dielectric layer 1102 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-κ dielectric layer 1104 may be formed using a suitable process such as ALD, CVD, PVD, plating, or combinations thereof. The conductive gate electrode 1104 may include a metal material such as, for example, Al, Cu, W, Ti, Ta, TiN, TiAl, TiAlN, TaN, NiSi, CoSi, or combinations thereof. In some other embodiments, the conductive gate electrode 1104 may include a polysilicon material. The polysilicon material may be doped with a uniform or non-uniform doping concentration. The conductive gate electrode 1104 may be formed using a suitable process such as ALD, CVD, PVD, plating, or combinations thereof.

Figure 12:
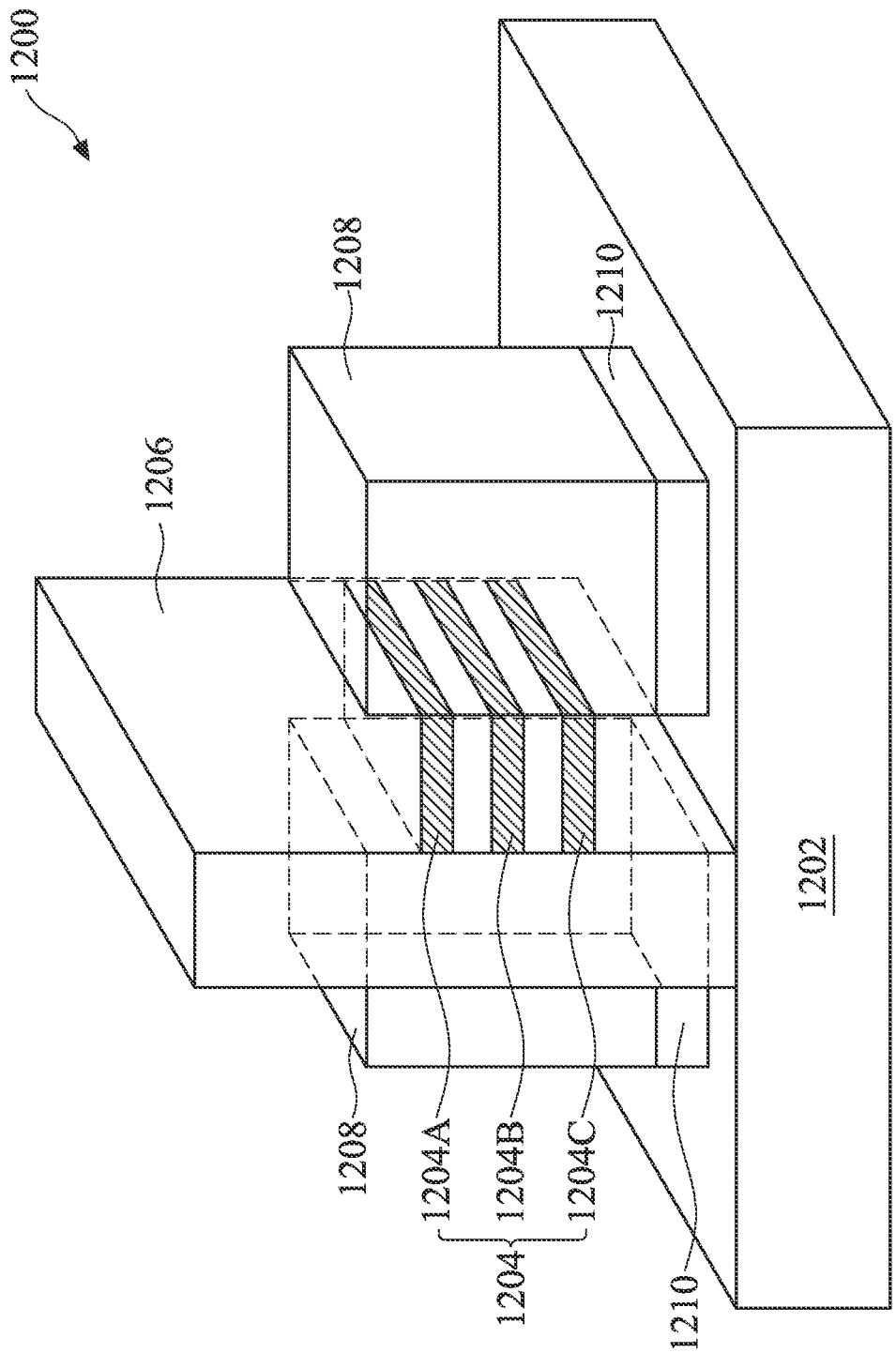
FIG. 12 illustrates a perspective view another example FinFET device, in accordance with some embodiments.

FIG. 12 depicts a perspective view of another example transistor 1200, in accordance with various embodiments. The transistor 1200 may have a conduction channel constituted by one or more other types of nanostructures such as, for example, nanosheets, nanowires, or nanobridges. The transistor 1200 may be made by at least some of the operations of the method 100 of FIG. 1 to have epitaxially grown source/drain regions electrically connected to a corresponding conduction channel but electrically isolated from an underlying substrate or conductive feature. For example, upon forming one or more nanostructures that are each wrapped by a dummy gate structure, the operations 110-118 may be used to form the transistor 1200.

As shown in FIG. 12, the transistor 1200 is formed on a substrate 1202. Over the substrate 1202, one or more nanostructures, e.g., 1204A, 1204B, and 1204C, that form a conduction channel 1204 are formed. In some embodiments, the conduction channel 1204 includes the same semiconductor material as the substrate 1202. An active gate structure 1206 is formed over the conduction channel 1204 to wrap around each of the nanostructures 1204A-C, with source/drain regions 1208 formed on respective sides of the active gate structure 1206 (and each of the nanostructures 1204A-C). For example, the active gate structure 1206 wraps around a full perimeter of each of the nanostructures 1204A-C, with ends of each of the nanostructures 1204A-C connected to the source/drain regions 1208, respectively. The transistor 1200 further includes dielectric structures 1210, each of which is vertically beneath a corresponding one of the source/drain regions 1208 to electrically isolate the source/drain regions 1208 from the substrate 1202.

In one aspect of the present disclosure, a semiconductor device is disclosed. The semiconductor device includes a substrate. The semiconductor device includes a semiconductor fin over the substrate and laterally extending along an axis. The semiconductor device includes a first source/drain region extending from a first end of the semiconductor fin along the axis. The semiconductor device includes a second source/drain region extending from a second end of the semiconductor fin along the axis. The semiconductor device includes a first dielectric structure and a second dielectric structure. The first source/drain region and the second source/drain region are vertically elevated from a surface of the substrate by the first and second dielectric structures, respectively.

In another aspect of the present disclosure, a semiconductor device is disclosed. The semiconductor device includes a substrate including a semiconductor material. The semiconductor device includes a conduction channel of a transistor disposed above the substrate. The conduction channel and the substrate include a similar semiconductor material. The semiconductor device includes a source/drain region extending from an end of the conduction channel. The semiconductor device includes a dielectric structure. The source/drain region is electrically coupled to the conduction channel and electrically isolated from the substrate by the dielectric structure.

In yet another aspect of the present disclosure, a method of fabricating a semiconductor is device is disclosed. The method includes forming a semiconductor fin over a substrate. The semiconductor fin protrudes from a top surface of isolation regions disposed on respective sides of a lower portion of the semiconductor fin. The method includes forming a dummy gate structure straddling a central portion of the semiconductor fin. The method includes removing at least one end portion of the semiconductor fin to form a trench and expose an end of the semiconductor fin, wherein the trench is recessed from the top surface. The method includes forming a dielectric structure having a lower portion embedded in the trench and an upper portion protruding from the top surface. The method includes growing a source/drain region over the dielectric structure, wherein the source/drain region extends from the end of the semiconductor fin. The method includes replacing the dummy gate structure with an active gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor fin over the substrate and laterally extending along a first axis;
   a first source/drain region extending from a first end of the semiconductor fin along the first axis;
   a second source/drain region extending from a second end of the semiconductor fin along the first axis;
   a first dielectric structure extending vertically below a lower surface of a gate dielectric layer disposed laterally between the first dielectric structure and a second dielectric structure;
   the second dielectric structure extending vertically below the lower surface of the gate dielectric layer, wherein the first source/drain region and the second source/drain region are vertically elevated from an upper surface of the gate dielectric layer by the first and second dielectric structures, respectively;
   a first isolation region disposed on a first side of a lower portion of the semiconductor fin along a second axis; and
   a second isolation region disposed on a second side of the lower portion of the semiconductor fin along the second axis.

2. The semiconductor device of claim 1, wherein at least a portion of the first dielectric structure and the second dielectric structure extend vertically below respective top surfaces of the first and second isolation regions.

3. The semiconductor device of claim 1, wherein the first source/drain region and the second source/drain region are electrically isolated from the substrate by the first and second dielectric structures, respectively.

4. The semiconductor device of claim 1, wherein each of the first and second dielectric structures includes a material selected from the group consisting of silicon oxide, silicon nitride, silicon carbide, silicon oxycarbide, silicon oxynitride, silicon carbonitride, silicon oxycarbonitride, and combinations thereof.

5. The semiconductor device of claim 1, wherein each of the first and second dielectric structures includes a high-k dielectric material.

6. The semiconductor device of claim 1, further comprising:
  a gate feature straddling a central portion of the semiconductor fin;
  a first portion of a spacer, straddling a first portion of the semiconductor fin next to the central portion, that is disposed between a first sidewall of the gate feature and the first source/drain region; and
  a second portion of the spacer, straddling a second portion of the semiconductor fin next to the central portion, that is disposed between a second sidewall of the gate feature and the second source/drain region.

7. The semiconductor device of claim 6, wherein bottom surfaces of the first source/drain regions and the second source/drain regions are vertically elevated from a bottom surface of the first portion of the spacer and the second portion of the spacer by the first and second dielectric structures, respectively.

8. The semiconductor device of claim 1, wherein the first and second dielectric structures have a height, extending from a surface of the substrate to a bottom surface of the first source/drain region and the second source/drain region, that ranges from about 1 nanometer (nm) to 100 nm.

9. The semiconductor device of claim 1, wherein each of the first source/drain region and the second source/drain region has a width extending along the first axis that is equal to or greater than a width of the first and second dielectric structures extended along the first axis.

10. The semiconductor device of claim 1, wherein the first end of the semiconductor fin is vertically aligned with an inner sidewall of the first dielectric structure elevating the first source/drain region, and the second end of the semiconductor fin is vertically aligned with an inner sidewall of the second dielectric structure elevating the second source/drain region.

11. A semiconductor device, comprising:
  a substrate comprising a semiconductor material;
  a conduction channel of a transistor disposed above the substrate, wherein the conduction channel and the substrate include a similar semiconductor material;
  a source/drain region extending from an end of the conduction channel;
  a dielectric structure extending from vertically below the conduction channel to vertically above the conduction channel, wherein the source/drain region is electrically coupled to the conduction channel, and electrically isolated from the substrate by the dielectric structure; and
  a pair of isolation regions sandwiching a lower portion of the conduction channel and a portion of the dielectric structure.

12. The semiconductor device of claim 11, wherein a bottom surface of the source/drain region is elevated vertically above a top surface of the pair of isolation regions by the dielectric structure.

13. The semiconductor device of claim 11, wherein the dielectric structure has a height, extending from a surface recessed from a top surface of isolation regions to a bottom surface of each of the source/drain region, that ranges from about 1 nanometer (nm) to about 100 nm, the isolation regions disposed on respective sides of the lower portion of the conduction channel.

14. The semiconductor device of claim 11, wherein the dielectric structure includes a material selected from the group consisting of silicon oxide, silicon nitride, silicon carbide, silicon oxycarbide, silicon oxynitride, silicon carbonitride, silicon oxycarbonitride, and combinations thereof.

15. The semiconductor device of claim 11, wherein the dielectric structure includes a high-k dielectric material.

16. The semiconductor device of claim 11, wherein the conduction channel includes at least one fin-like structure protruding from the substrate.

17. The semiconductor device of claim 11, wherein the conduction channel includes one or more sheet-like structures vertically spaced apart from the substrate, each of the one or more sheet-like structures being vertically spaced apart from each other by a gate structure.

18. The semiconductor device of claim 11, wherein the source/drain region has a width extending along an axis along which the conduction channel also extends, the width being equal to or greater than a width of the dielectric structure extending along the axis.

19. A method of fabricating a semiconductor device, comprising:
  forming a semiconductor fin over a substrate, wherein the semiconductor fin extends along a first axis and protrudes from a top surface of isolation regions, wherein the isolation regions are disposed on respective sides of a lower portion of the semiconductor fin along a second axis;
  forming a dummy gate structure extending along the second axis and straddling a central portion of the semiconductor fin;
  removing at least one end portion of the semiconductor fin to form a trench and expose an end of the semiconductor fin, wherein the trench is recessed from the top surface;
  forming a dielectric structure having a lower portion embedded in the trench and an upper portion protruding from the top surface;
  growing a source/drain region over the top surface of the dielectric structure in the trench, wherein the source/drain region extends from the end of the semiconductor fin; and
  replacing the dummy gate structure with an active gate structure.

20. The method of claim 19, wherein the dielectric structure includes a material selected from the group consisting of silicon oxide, silicon nitride, silicon carbide, silicon oxycarbide, silicon oxynitride, silicon carbonitride, silicon oxycarbonitride, and combinations thereof.

* * * * *